(12) United States Patent
Audoir et al.

(10) Patent No.: US 9,286,415 B2
(45) Date of Patent: Mar. 15, 2016

(54) METHOD, A SYSTEM AND A COMPUTER PROGRAM FOR MONITORING THE PROGRESS OF THE DESIGN OF A PRODUCT

(71) Applicant: Dassault Systemes, Velizy Villacoublay (FR)

(72) Inventors: Yannick Audoir, Paris (FR); Nicolas Loubradou, Dampierre en Yvelines (FR)

(73) Assignee: Dassault Systemes, Velizy Villacoublay (FR)

( * ) Notice: Subject to any disclaimer, the term of this patent is extended or adjusted under 35 U.S.C. 154(b) by 495 days.

(21) Appl. No.: 13/631,506

(22) Filed: Sep. 28, 2012

(65) Prior Publication Data

US 2013/0268245 A1 Oct. 10, 2013

(30) Foreign Application Priority Data

Sep. 30, 2011 (EP) .................................. 11306267

(51) Int. Cl.
*G06F 17/50* (2006.01)
*G06Q 10/06* (2012.01)

(52) U.S. Cl.
CPC ................ *G06F 17/50* (2013.01); *G06Q 10/06* (2013.01)

(58) Field of Classification Search
CPC ................................ G06Q 10/06; G06F 17/50
USPC ............................................................. 703/1
See application file for complete search history.

(56) References Cited

PUBLICATIONS

Doug Rosenberg et al., "Use case driven object modeling with UML Theory and Practice," 2007, Apress, pp. 373-391.*
"ENOVA Requirements Central User's Guide," 2008, Dassault Systems, 236 pages.*
Roel Wieringa, "An introduction to requirements traceability," 1995, http://doc.utwente.nl/76217/1/95-traceability.pdf, pp. 1-22.*
B. Ramesh et al., "Toward reference models for requirements traceability," 2001, IEEE Transactions on Software Engineering, vol. 27, No. 1, pp. 58-93.*
N. Aizenbud-Reshef et al. "Model Traceability," 2006, IBM Systems Journal, vol. 45, No. 3, pp. 515-526.*
Joseph J. Lavin, "Energy efficiency projects in Pennsylvania small businesses," 2009, University of Pennsyvania, pp. 1-39.*
Michael Edwards et al., "A methodology for systems requirements specification and traceability for large real-time complex systems," 1991, Naval Surface Warfare Center, 60 pages.*
Dan Vanderboom, "Four Traversal Patterns for Tree<T>," Sep. 1, 2010, Wayback Machine, "https://dvanderboom.wordpress.com/2010/04/05/four-traversal-patterns-for-treet/," six pages.*
European Search Report in European Patent Application No.: EP11306267.3 (Dated Mar. 2, 2012).

* cited by examiner

*Primary Examiner* — Kamini S Shah
*Assistant Examiner* — Russ Guill
(74) *Attorney, Agent, or Firm* — Hamilton, Brook, Smith & Reynolds, P.C.

(57) ABSTRACT

A computer-implemented method for monitoring the progress of the implementation of a product design. A status representing the progress of the implementation is determined for each component of a first tree associated with the product design by first analyzing the components belonging to the lowest hierarchy level, the analysis being then conducted recursively on other components up to the highest hierarchy level, a component being analyzed by checking if an implementation link has been set up with a component belonging to a second tree associated with the product design and by checking the progress status of the children of the analyzed component.

16 Claims, 7 Drawing Sheets

METHOD, A SYSTEM AND A COMPUTER PROGRAM FOR MONITORING THE PROGRESS OF THE DESIGN OF A PRODUCT

RELATED APPLICATION(S)

This application claims priority under 35 U.S.C. §119 or 365 to Europe, Application No. 11306267.3, filed Sep. 30, 2011. The entire teachings of the above application are incorporated herein by reference.

FIELD OF THE INVENTION

This invention relates to a method, a system and a computer program for monitoring the progress of the design of a product and is particularly, but not exclusively, applicable to product edition systems and more specifically to the traceability of a product design.

BACKGROUND OF THE INVENTION

Product edition systems are known to include Computer-Aided Design or CAD, which relates to software solutions for authoring product design. A number of product and programs are offered on the market for the design of objects (or parts) or assemblies of objects, forming a product, such as the one provided by Dassault Systemes under the trademark CATIA.

Many products conceived today such as aircrafts or satellites are achieving a high level of complexity. It is usual that several teams of engineers work separately on the design of different components composing a product. The product is divided into a plurality of components and sub-components. Coordinating the work of dozens or possibly hundreds of workers is difficult. In order to manage this complexity, a product edition system can be used.

A well known system engineering approach defined by the International Council of Systems Engineering (INCOSE) defines four design stages namely R for Requirements, F for functional, L for Logical and P for Physical. The said design stages are represented on FIG. 1 and they can be implemented into a product edition system.

The requirement stage 100 leads to a structured definition of all the needs that the product must fulfil and a definition of the rules and regulations that should be respected.

The functional stage 101 leads to a structured definition of the services provided by the product in order to answer to its requirements. In other words, the aim of the functional stage is to define the system functions that will address the requirements.

The logical stage 102 aims at defining the logical architecture of the product through a structure of logical components. In other words, the functions are distributed on different logical components within different sub-systems.

Finally, the physical stage 103 provides the architecture of the product, that is to say the geometry of the logical components and how they fit together in a digital model of the physical product. This approach is often designated by the acronym RFLP.

Additionally, implement relations 104, 105, 106, 107, 108 can be created between different components belonging to different RFLP partitions 100, 101, 102, 103 in order to capture why an entity has been added to the definition.

For example, if a function is added in the functional stage to fulfil a given requirement, an architect will create an implement relation between the two components, that is to say between the function and the requirement. Implement relations can be typically set up between Requirements and Functions stages, Functions and Logical stages, Logical components and Physical stages. It is also possible to directly link a requirement to a logical component or to a physical component for some specific requirements that can not be translated into a functionality of the product. This is usually the case for requirements linked to a physical characteristic of the product to design such as the weight or the colour.

The components and sub-components that are designed and developed in one of the design stages are usually represented using a tree, the said tree being generally directed and acyclic.

A simple example is illustrated on FIG. 2. Two trees 200, 201 are represented. For a given product, the first tree 200 comprises the components associated to the functional stage and the second tree 201 comprises the components associated to the logical stage.

The trees have a hierarchical structure. The components of the first tree 200 are organized into four hierarchical levels 202, 203, 204, 205. The first level 202, which is the highest one comprises a single component A. The second level 203 comprises two components B and C. The third level 204 comprises four components D, E, F and I. The fourth level 205 is the lowest level of the first tree 200 and comprises two components G and H. Thanks to this hierarchical structure and with the use of hierarchical links, it is possible to introduce the notion of sub-components. For example, components G and H are seen as sub-components of component F because of a hierarchical link 210.

Regarding the second tree 201, the components are also organized into four hierarchical levels 206, 207, 208, 209. The first level 206 comprises one component 1 and is considered as the highest level. The second level 207 comprises two components 2 and 5. The third level 204 comprises five components 3, 4, 6, 9 and 10 and is considered as the lowest level of this tree. The fourth level 209 comprises two components 7 and 8.

As already introduced, in order to take into account progress in the product design, it is possible for a system designer to use implement relations 211, 212, 213, 214. Those relations are called implementation links in the sequel. In FIG. 2, the logical component 3 implements the functional component B, thus an implementation link 211 has been set up between the said components. For similar reasons, an implementation link 212 has been set up between components 4 and D, an implementation link 213 has been set up between components 6 and F and an implementation link 214 has been set up between components 10 and I.

The system designers and project leaders may have to check regularly the status of the project. It is important, for example, to check what part of the functional design of the product has been implemented or not into the logical architecture at a given point in time. For that purpose, a comparison between components of the trees representing the functional and the logical stages can be performed in order to verify whether all components are implemented or if a given component has been implemented in time.

For a simple system to design, this comparison can be done manually because of a limited number of components. However, for the design of a complex system, each tree comprises a large number of components. In that case, the comparison between trees can not be done manually and the use of a tool that performs this comparison automatically is required.

A well-known technique that can be used is to compare flat lists of components. The result of this comparison can be presented as a matrix, the elements of this matrix being used to monitor the progress of the product design.

For that purpose, a first approach is based on checking automatically leaf nodes traceability. In the sequel, a leaf node refers to a component without children. As an illustration, the first tree 200 presented on FIG. 2 comprises six leaf nodes B, D, E, G, H and I.

FIG. 3 presents two examples of traceability matrices obtained based on leaf nodes analysis. A first matrix 300 comprises a column 302 with one element per leaf node. For each leaf node associated with an implementation link, the identifier of a corresponding component in the second tree is memorized. In this example, identifiers of the components belonging to the first tree are letters and identifiers of the components belonging to the second tree are numbers. Considering this example, there is a implementation link between components B and 3, D and 4, 1 and 10. An other way to memorize this information is to use a matrix 301 that comprises a sub-matrix 303 with a number of column corresponding to the number of leaf nodes that belongs to the second tree 201 and a number of lines corresponding to the number of leaf nodes that belong to the first tree 200. The elements of the matrix that correspond to an existing implementation link are set up to a predetermined value while other elements are set up to an other predetermined value. For example, a binary digit can be used as an element of this matrix. It appears that the two aforementioned matrix are equivalent in term of content.

A second existing approach is based on a checking of every components belonging to the trees to compare. FIG. 4 presents two examples of traceability matrices obtained comparing every component of the trees. A first matrix 400 comprises a column 402 with one element for each component of the first tree 200. A second matrix comprises a sub-matrix 303 with a number of column equal to the number of components belonging to the second tree 201 and a number of lines corresponding to the number of components belonging to the first tree 200.

The major concern of these approaches is that the hierarchical structure of the trees is not taken into account. In particular, they do not handle properly cases where relations are created between intermediate components. For example, if there is an implementation link between 6 and F, this means that components implementing G and H have been implemented in the second tree. Unfortunately, this information can not be obtained directly from reading the matrix described above. Additionally if H is not implemented and that component 7 implements component G, the information that component F has been partially implemented is not available directly.

In the approach based on leaf nodes traceability, a component with one or more child is not considered.

Concerning the approach were all components are listed flatly, these links on intermediate nodes are incorrectly managed during global coverage computation as the hierarchy is not considered.

Therefore, traceability tools that use those approaches are inadequate to monitor accurately the advancement of a system design. This is particularly critical in a scenario involving OEM suppliers (Original Equipment Manufacturer) and where the said suppliers are responsible of the design of a given component. A difficult situation to manage in term of traceability is when an OEM supplier is selected to provide a set of logical components corresponding to a functional component, for example, when an OEM supplier has to design component 6 that implements component F.

SUMMARY OF THE INVENTION

According to the invention, there is provided a computer-implemented method for monitoring the progress of the implementation of a product design, the said product design being organized in at least a first and a second stage, the first stage being associated to a first tree, the second stage being associated to a second tree, each tree comprising one or several components organised hierarchically, one or several components belonging to one of these two trees being able to implement a component belonging to the other tree, two components belonging respectively to the two different trees which could be connected by an implementation link showing that the component of the first tree is implemented by or implements the component of the second tree. A status representing the progress of the implementation is determined for each component of the first tree by first analysing the components belonging to the lowest hierarchy level, the analysis being then conducted recursively on other components up to the highest hierarchy level, a component being analysed by checking if an implementation link has been set up with a component belonging to the second tree and by checking the progress status of the children of the analysed component.

According to a complementary aspect, the product design is organized in four stages following the RFLP standard.

According to a complementary aspect, two compatible trees are selected if more than two trees are associated to the product design, the said two trees being compatible if it is possible to link them by using implementation links.

According to a complementary aspect, three types of statuses can be allocated to the components of the first tree: projected P for a component that has been fully implemented by the use of one or more components belonging to the second tree, partially projected PP for a component that has been partially implemented by the use of one or more components belonging to the second tree and non-projected NP for a component that has not been implemented at all.

Alternatively, three types of statuses can be allocated to the components of the first tree: projected P for a component that fully implements a component belonging to the second tree, partially projected PP for a component that partially implements a component belonging to the second tree and non-projected NP for a component that do not implements a component belonging to the second tree.

According to a complementary aspect, a step checks if the analysed component is not linked.

According to a complementary aspect, a step allocates the P status if an analysed component is linked.

According to a complementary aspect, a step checks if an analysed component has children and what is the status of the said children.

According to a complementary aspect, a step checks if all children of an analysed component have the P status, the P status being allocated to the analysed component in that case.

According to a complementary aspect, a step checks if at least one of the children of an analysed component has the PP status.

According to a complementary aspect a step allocates the PP status to an analysed component if at least one of its children has the PP status.

According to a complementary aspect, a step checks when it is not verified that at least one of the children of an analysed component has the PP status, if at least one of the children of the said analysed component has the NP status and at least one child has the P status, the PP status being allocated to the analysed component in that case.

According to a complementary aspect, the NP status is allocated by default to the analysed component.

According to a complementary aspect, the first tree is represented graphically, a component with P status being visible thanks to a first type of mark and components with the PP status being visible thanks to a second type of mark.

According to a complementary aspect, the statuses of the components are re-calculated periodically and if a given component is not designed at a predetermined point in time, a warning message is transmitted to a project leader.

There is also provided a computer program product, stored on a computer readable medium comprising code means for causing a computer to implement the method described previously.

There is also provided a system for monitoring progress in a product design, wherein at least one database is connected with a server for communicating over a packet-switched network with a plurality of client-stations, the said client-stations allowing designers to work remotely from the database, the said database storing the architectures of the different trees representing the design stages and storing design files related to their components, at least one client-station comprising means to implement the method described previously.

BRIEF DESCRIPTION OF THE DRAWINGS

A better understanding of the embodiments of the present invention can be obtained from the following detailed description in conjunction with the following drawings, in which.

MORE DETAILED DESCRIPTION

Figure 5:
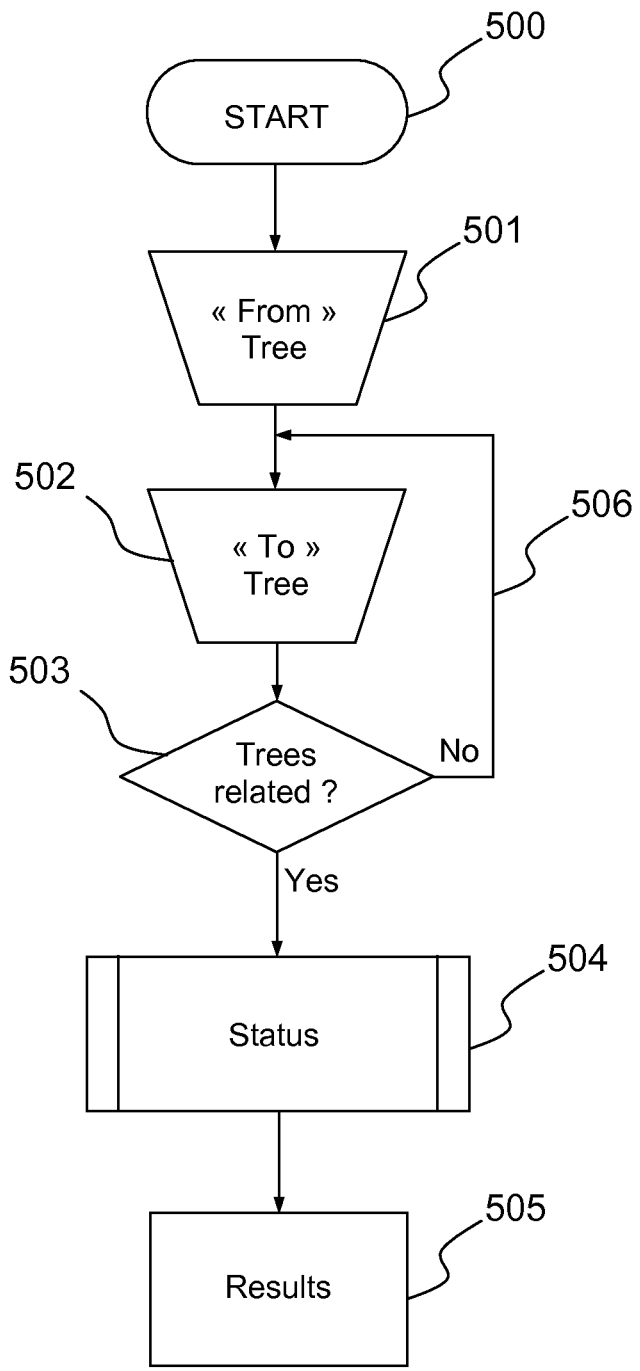
FIG. 5 is a flow diagram illustrating a method to check traceability between trees representing different design stages of a product.

FIG. 5 is a flow diagram illustrating a method to check traceability between trees representing different design stages of a product.

The invention can be included in a platform such as Catia V6 proposed by Dassault Systèmes. It can be applied in order to compare trees defined in the context of RFLP methodology. The method may also be applied to other types methodology comprising at least two design stages and their associated trees.

A traceability tool command can be implemented in the said platform. Once this command has been activated 500, the user has to select two trees 501, 502. The first tree is called the 'From' tree and the second tree is called the 'To' tree. It is then verified 503 if the two trees are of compatible nature regarding the implement relation. In other words, it is checked if it is possible to link the selected trees by using implementation links. If the selected trees are not compatible, the user has to select another 'To' tree 506. Alternatively, the user may select again the two trees.

Once two compatible trees are selected, the tool analyses the links between the components of the 'From' tree and the components of the 'To' tree and allocates a status to each component of the 'To' tree 504. Three different statuses can be allocated, for example, projected P, partially projected PP and non-projected NP. A component with a P status is a component that has been fully implemented by the use of one or more components belonging to the 'From' tree. A component with a PP status is a component that has been partially implemented by the use of one or more components belonging to the 'From' tree. A component with a NP status is a component that has not been implemented yet by the teams that are responsible of the design stage associated to the 'From' tree.

Those results can be presented graphically 505 for the system designer or the project leader to be informed quickly of the progress of the project. Alternatively, the status that has been determined for each component may be used for project management purpose. For example, the method can be applied periodically and if a given component in not delivered in time by an OEM supplier, a warning message can be transmitted to the project leader.

In the example described above, the components belonging to the 'From' tree are used to implement the components belonging to the 'To' tree. If the RFPL methodology is used, an example is to associate the 'From' tree to the logical stage and the 'To' tree to the functional stage. In that case, the method can be advantageously used to quickly check which components of the functional stage are not implemented, which components are partly implemented and which components are completely implemented.

Alternatively, the 'From' tree and the 'To' tree can be selected such that the components belonging to the 'From' tree are implemented by the components belonging to the 'To' tree. If the RFPL methodology is used, the 'From' tree can be associated to the functional stage and the 'To' tree can be associated to the logical stage. In that case, the method can be adapted to quickly check which components of the logical stage are relevant for implementing the components associated to the functional stage and which are not relevant. When a component is considered as irrelevant, a designer in charge of developing components at the logical stage may decide to erase or ignore the said component. Similarly, the method can be used to check which components are partially relevant, a component being partially relevant when some of its sub-components are not relevant.

Figure 6:
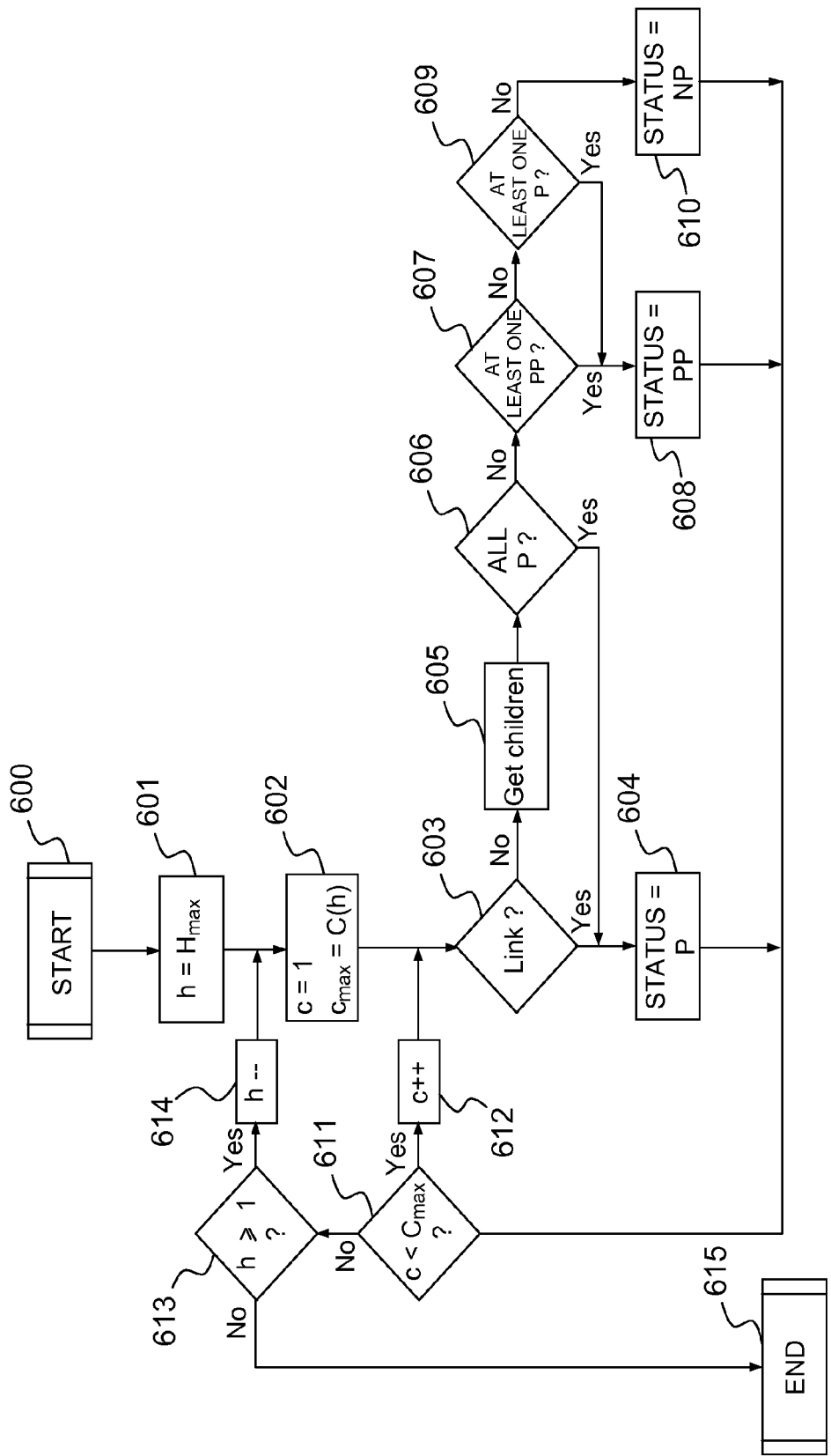
FIG. 6 is a flow diagram illustrating how the status of components belonging to the 'To' tree can be determined.

FIG. 6 is a flow diagram illustrating how the status of components belonging to the 'To' tree can be determined. In this embodiment, the two trees are such that the components belonging to the 'From' tree are used to implement the components belonging to the 'To' tree.

This method integrates that the different stages of a product definition are based on a tree structure. The status of the components composing the 'To' tree is determined based on a projection of the 'From' tree.

Figure 1:
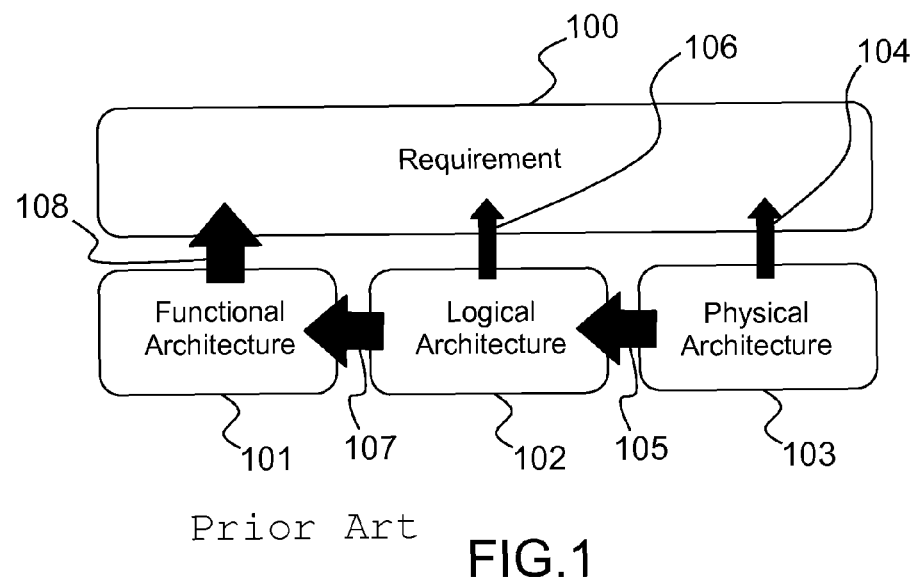
FIG. 1 represents the 4 design stages according to the RFLP methodology.
Figure 2:
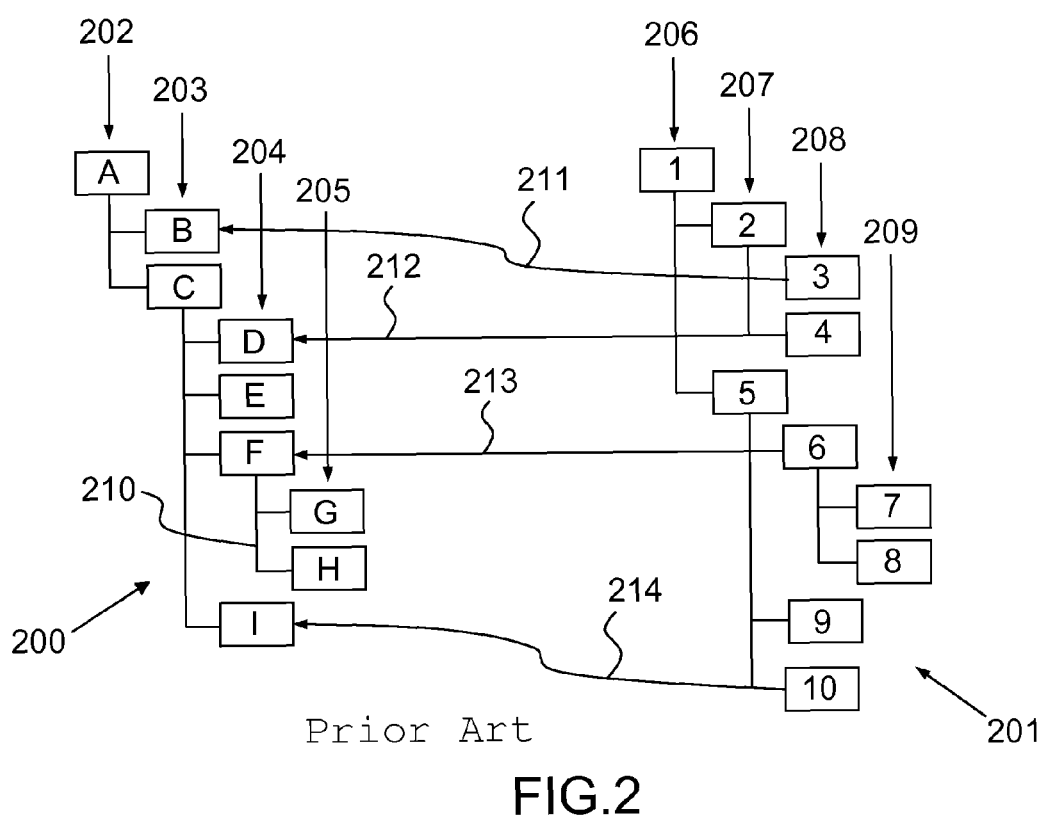
FIG. 2 shows two trees associated to design stages of a product.
Figure 3:
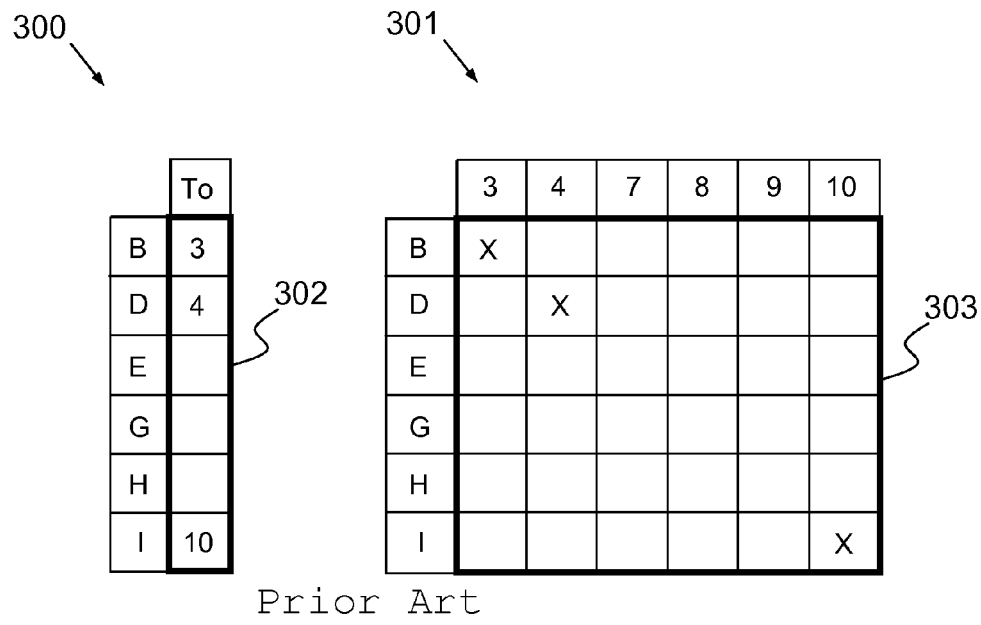
FIG. 3 presents two examples of traceability matrix obtained based on leaf nodes analysis.
Figure 4:
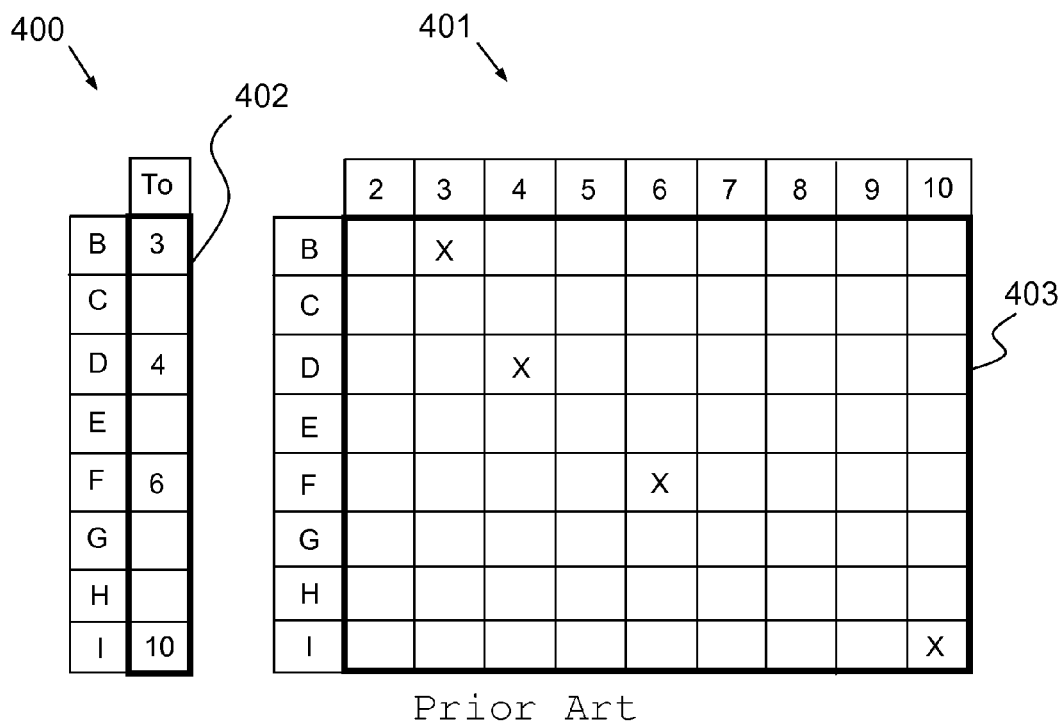
FIG. 4 presents two examples of traceability matrix obtained comparing every component of the trees.

A tree comprises several hierarchical levels. The total number of hierarchical levels in a tree is denoted by Hmax. The method is based on a recursive computing that begins to analyse components belonging to the lowest level of hierarchy. Considering the example of FIG. 2, status determination will start with components G and H at hierarchical level Hmax=4. For that purpose, the method comprises an initialization step 601 initializing a variable h representing the current hierarchical level such that h=Hmax.

Then, components belonging to hierarchical level h are analysed. It begins with a first component and goes on with the other components until the status of all components of level h is determined. To do so, the method comprises a step 602 where a variable c is initialized to 1 and where the total number of components Cmax belonging to the hierarchical level h is identified. For that purpose, a function CO defined such that Cmax=C(h) can be used.

Then, a step 603 determines if component c belonging to hierarchical level h is linked to the 'From' tree, that is to say if an implementation link exists. If yes, the P status is allocated 604 to this component.

If component c is not linked 603, it is checked 605 if component c has children and what is the status of the said children.

If all children of component c have the P status 606, this P status is also allocated to him 604.

If not, it is checked 607 if at least one of the children of component c has the PP status 607. If yes, the PP status is allocated 608 to c.

If not, it is checked 609 if at least one of the children of component c has the NP status and at least one child has the P status. If yes, the status 'PP' is also allocated 608 to c. If not, the NP status is allocated 610 to c.

Once the status of component c is allocated, it is verified 611 if there are other components belonging to the hierarchical level h that have not been analysed yet. If yes, the variable c is incremented 612 and the status of this component is determined. If not, it is verified 613 if the current hierarchical level h is not the highest level of the 'To' tree. If this condition is fulfilled, the variable h is incremented 614. If not, this means that all components of the tree have been analysed and status allocation is ending 615.

The flow diagram described above and illustrated on FIG. 6 represents an embodiment of the invention where the components belonging to the 'From' tree are used to implement the components belonging to the 'To' tree. In that case, the method can be advantageously used to quickly check which components of the functional stage are not implemented, which components are partly implemented and which components are completely implemented.

Alternatively, the skilled person would appreciate that it is possible to arrange the flow diagram when the components belonging to the 'From' tree are implemented by the components belonging to the 'To' tree, the method being used in that case to appreciate if a component belonging to the 'To' tree is relevant, partially relevant or irrelevant for the product design.

The steps of the method described above can be performed by one or more programmable processors executing a computer program to perform functions of the invention by operating on input data and generating output.

A computer program can be written in any programming language, including compiled or interpreted languages, and the computer program can be deployed in any form, including as a stand-alone program or as a subroutine, element or other unit suitable for use in a computing environment. A computer program can be deployed to be executed on one computer or on multiple computers at one site or distributed across multiple sites and interconnected by a communication network.

Figure 7:
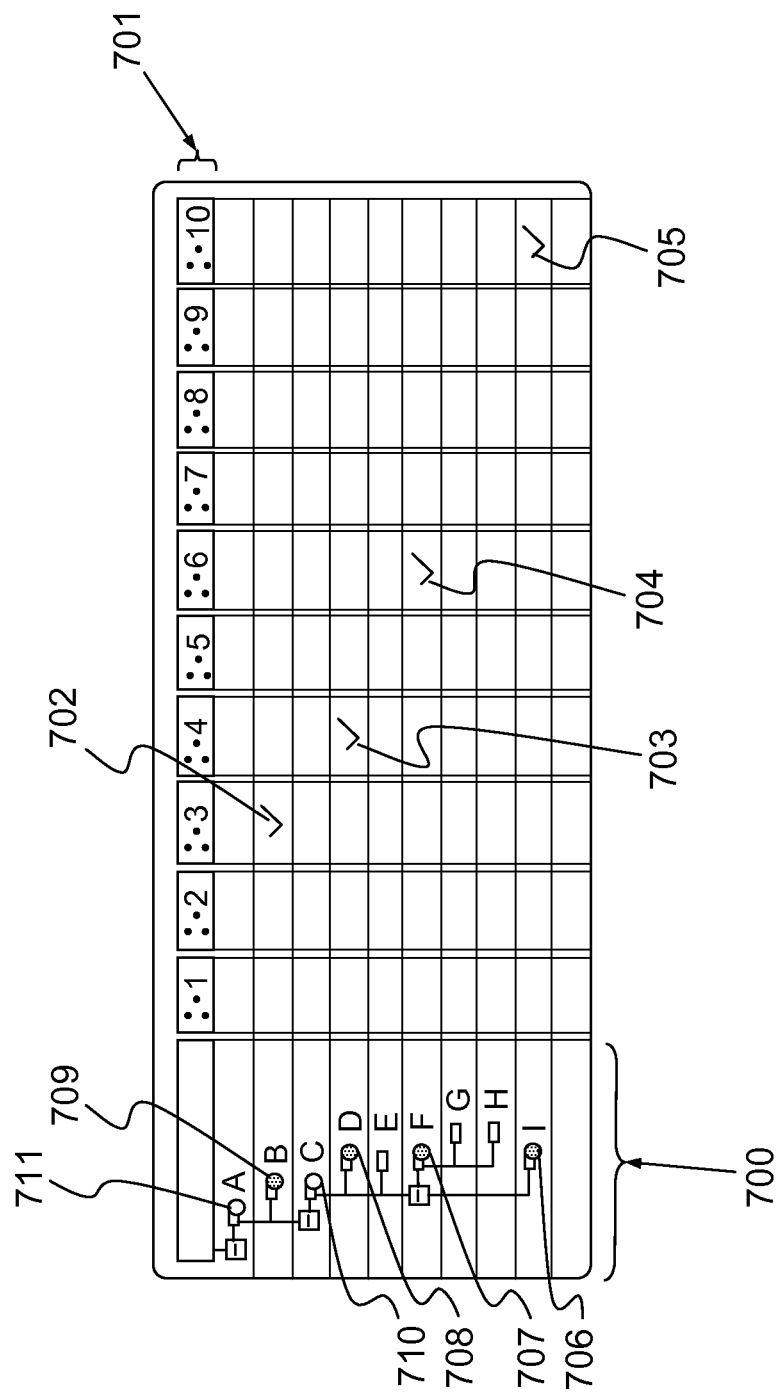
FIG. 7 provides an example of a traceability matrix showing the status of each component of a tree.

FIG. 7 provides an example of a traceability matrix showing the status of each component of a tree.

As described previously, the identified status can be presented graphically, for example in a table or a matrix.

A column 700 of the matrix can be associated to the components of the 'To' tree and a row 701 can be associated to the components of the 'From' tree.

A cell intersecting a component of the 'From' tree and a component of the 'To' tree where a mark 702, 703, 704, 705 is displayed corresponds to an implementation link between a component of the first tree and a component of the second tree.

Depending of the status allocated to each component of the first tree, a special mark may be displayed. For example, components with P status are visible thanks to a first type of mark 706, 708, 709 and components with the PP status are visible thanks to a second type of mark 710, 711. Advantageously, this graphical presentation allows a product designer or a project leader to have a straightforward and quick status on the progress of a product design.

Figure 8:
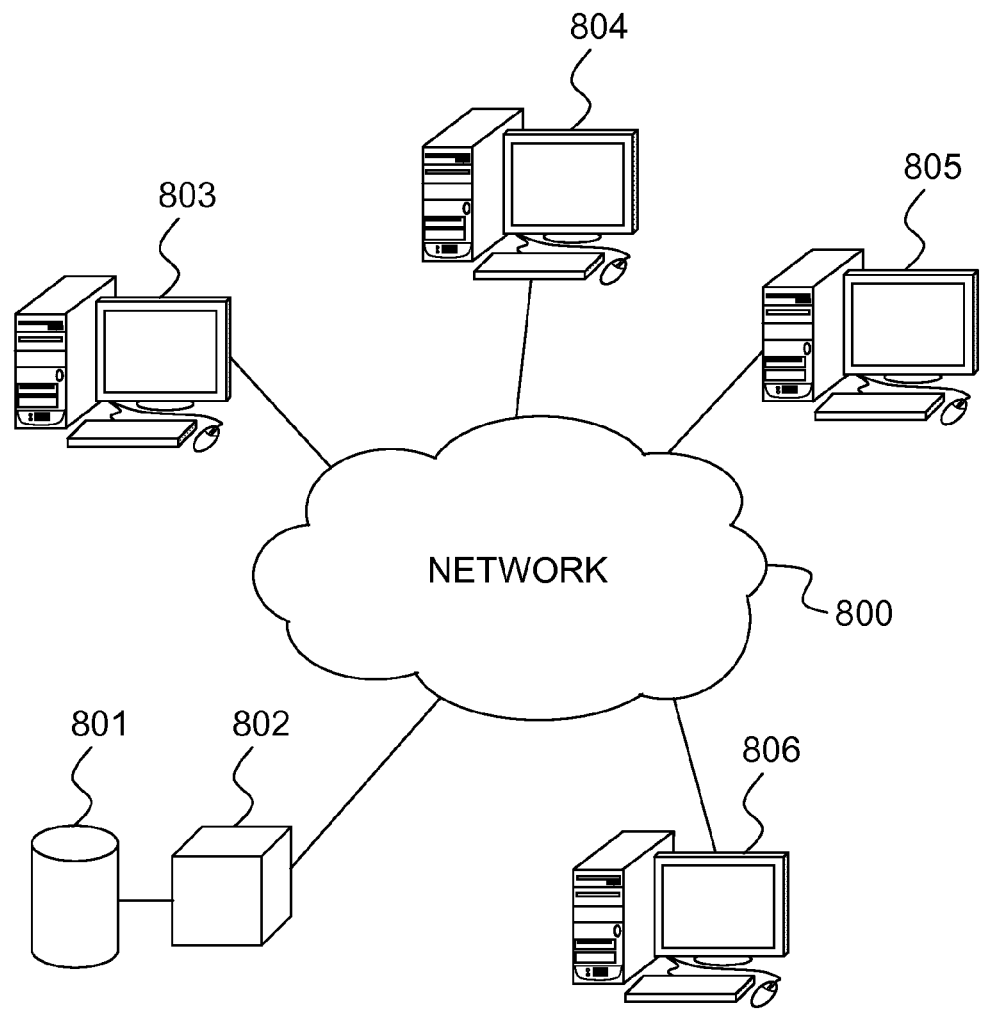
FIG. 8 is a schematic representation of a system that includes a network and several devices used to manage traceability of components during their design.

FIG. 8 is a schematic representation of a system that includes a network and several devices used to manage traceability of components during their design. The system includes at least one database 801 connected with a server 802 for communicating over a packet-switched network 800. Product designers belonging to different teams can work remotely from the database 801 at client-stations 803, 804, 805, 806. Each client-station can have a local storage, respectively, for storing files related to components that have been transferred from the database 801. The database 801 stores the architectures of the different trees representing the design stages and the design files related to their components. Thus, the traceability method can be applied from any client-station having access to the said database.

Figure 9:
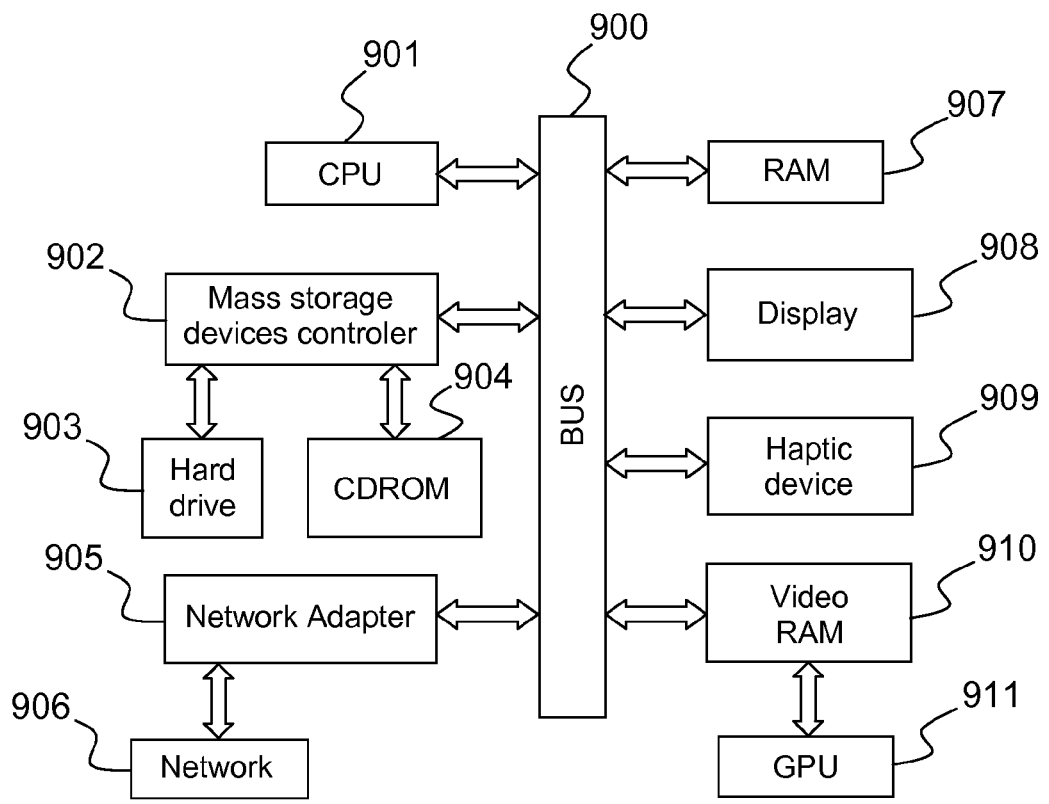
FIG. 9 shows an example of client computer system.

FIG. 9 shows a client computer system, e.g. a workstation of a user. The client computer comprises a central processing unit (CPU) 901 connected to an internal communication BUS 900, a random access memory (RAM) 907 also connected to the BUS. The client computer is further provided with a graphical processing unit (GPU) 911 which is associated with a video random access memory 910 connected to the BUS. Video RAM 910 is also known in the art as frame buffer. A mass storage device controller 902 manages accesses to a mass memory device, such as hard drive 903. Mass memory devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks 904. Any of the foregoing may be supplemented by, or incorporated in, specially designed ASICs (application-specific integrated circuits). A network adapter 905 manages accesses to a network 906. The client computer may also include a haptic device 909 such as cursor control device, a keyboard or the like. A cursor control device is used in the client computer to permit the user to selectively position a cursor at any desired location on display 908. In addition, the cursor control device allows the user to select various commands, and input control signals. The cursor control device includes a number of signal generation devices for input control signals to system. Typically, a cursor control device may be a mouse, the button of the mouse being used to generate the signals.

The method, computer program and system as described above and in the drawings are for ease of description only and are not meant to restrict the computer programs, systems or methods to a particular arrangement or process in use.

The invention claimed is:

1. A computer-implemented method for monitoring the progress of the implementation of a product design comprising:

using a processor to perform the steps of:
organizing a product design in at least a first and a second stage, the first stage being associated with a first tree and the second stage being associated with a second tree, wherein each tree comprises one or more components organised hierarchically, and wherein the one or more components belonging to one of the two trees are capable of implementing the one or more components belonging to the other tree;

for each component of the first tree, starting with a lowest hierarchy level component and continuing hierarchically through a highest hierarchy level component: checking whether an implementation link has been set up between the component and at least one of the components belonging to the second tree, checking a status of each of any children of the component, and setting a status of the component depending on whether said implementation link has been set up and on the status of each of said children, each status representing an amount of progress toward implementing the product design; and generate and display a traceability matrix to show progress of the implementation of the product design, the traceability matrix displaying symbols representing said implementation links between the first and second trees and said status of each component of the first tree.

2. The method according to claim 1, wherein the product design is organized in four stages following a Requirements Functional Logical Physical (RFLP) standard.

3. The method according to claim 1, wherein two compatible trees are selected for the first and second trees if more than two trees are associated with the product design, wherein trees are compatible if linkable by implementation links.

4. The method according to claim 1, wherein three types of statuses allocatable to each of the components of the first tree comprise projected (P) for when the component has been fully implemented by one or more components belonging to the second tree, partially projected (PP) for when the component has been partially implemented by one or more components belonging to the second tree and non-projected (NP) for when the component has not been implemented at all.

5. The method according to claim 1, wherein three types of statuses allocatable to the components of the first tree comprise projected (P) for the one or more components that fully implement at least one of the components belonging to the second tree, partially projected (PP) for the one or more components that partially implement at least one of the components belonging to the second tree and non-projected (NP) for the one or more components that do not implement any components belonging to the second tree.

6. The method according to claim 1, wherein for each component of the first tree, checking the status further comprises checking if the component is not linked.

7. The method according to claim 6, further comprising allocating a P status if the component is linked.

8. The method according to claim 6, wherein NP status is allocated by default to the component.

9. The method according to claim 1, further comprising allocating a P status to the component if all children of the component have P status.

10. The method according to claim 1, further comprising checking if at least one of the children of the component has PP status.

11. The method according to claim 10, further comprising allocating PP status to the component if at least one of its children has PP status.

12. The method according to claim 11, further comprising allocating PP status to the component when at least one of the children of the component has NP status and at least one of the children of the component has P status.

13. The method according to claim 1, wherein the first tree is represented graphically with the components with P status being visible thanks to a first type of mark and the components with PP status being visible thanks to a second type of mark.

14. The method according to claim 1, wherein the statuses of the components of at least one of the trees are re-calculated periodically and if a given component is not designed at a predetermined point in time, a warning message is transmitted to a project leader.

15. A computer program product, stored on a non-transitory computer readable medium comprising code means for causing a computer to implement the method of claim 1.

16. A system for monitoring progress in a product design, comprising: at least one database; and
a server connected to the at least one database for communicating over a packet-switched network with a plurality of client-stations, wherein the plurality of client-stations allow for designers to work remotely from the at least one database, the at least one database storing a plurality of architectures of a plurality of trees representing one or more design stages and storing a plurality of design files related to the trees' components, and at least one client-station capable of implementing the method of claim 1.

* * * * *